(12) United States Patent
Williams

(10) Patent No.: US 7,000,538 B2
(45) Date of Patent: *Feb. 21, 2006

(54) STENCIL AND APPARATUS FOR SUPPORTING AND TENSIONING THE STENCIL

(75) Inventor: David Godfrey Williams, Wirral (GB)

(73) Assignee: Alpha Fry, Ltd., Surrey (GB)

( * ) Notice: Subject to any disclaimer, the term of this patent is extended or adjusted under 35 U.S.C. 154(b) by 0 days.

This patent is subject to a terminal disclaimer.

(21) Appl. No.: 10/998,863

(22) Filed: Nov. 29, 2004

(65) Prior Publication Data

US 2005/0066827 A1    Mar. 31, 2005

Related U.S. Application Data

(60) Continuation of application No. 09/586,824, filed on Jun. 5, 2000, which is a division of application No. 09/483,253, filed on Jan. 13, 2000, now Pat. No. 6,289,804, which is a continuation of application No. 08/983,621, filed on Jun. 1, 1998, now Pat. No. 6,067,903.

(30) Foreign Application Priority Data

Jul. 20, 1995  (GB) ............................ 9514927
Jul. 18, 1996  (GB) ..................... PCT/GB96/01722

(51) Int. Cl.
   *B05C 17/05*    (2006.01)
(52) U.S. Cl. .................................. 101/127.1; 38/102.3
(58) Field of Classification Search ............. 101/114, 101/127, 127.1, 129, 415.1; 38/102–102.91; 160/327, 328, 329, 372, 378, 395
See application file for complete search history.

(56) References Cited

U.S. PATENT DOCUMENTS

| 2,073,379 A | 3/1937 | Rasmussen ................. 101/127 |
| 2,563,972 A | 8/1951 | Steen et al. ............. 101/127.1 |
| 3,303,777 A | 2/1967 | Feier et al. ............. 101/127.1 |
| 3,416,445 A | 12/1968 | Krueger, Jr. ............. 101/128.1 |
| 3,608,484 A | 9/1971 | Bubbley et al. .......... 101/127.1 |
| 4,442,772 A | 4/1984 | Bubbley ................. 101/127.1 |
| 5,170,058 A | 12/1992 | Berasi et al. ............... 250/548 |
| 5,220,867 A | 6/1993 | Carpenter ................ 101/127.1 |
| 5,979,312 A | 11/1999 | Williams ..................... 101/127 |
| 5,983,790 A | 11/1999 | Switzer et al. ........... 101/127.1 |
| 6,067,903 A | 5/2000 | Williams ................. 101/127.1 |
| 6,289,804 B1 | 9/2001 | Williams ................. 101/127.1 |

FOREIGN PATENT DOCUMENTS

FR    744901    4/1933
GB    2264460   9/1993

*Primary Examiner*—Ren Yan
(74) *Attorney, Agent, or Firm*—Mintz, Levin, Cohn, Ferris, Glovsky and Popeo, P.C.

(57) ABSTRACT

A support and tensioning frame for a stencil to enable solder paste to be applied to printed circuit boards and other electronic substrates includes a support frame engaged with at least two opposed mounting members. Each mounting member includes at least one projection for engaging an aperture in a stencil to mount the stencil under tension. A permanent-biasing mechanism engages one or more of the mounting members to place the stencil under tension. A second biasing mechanism engages the mounting member to provide a bias opposite that of the permanent-biasing mechanism to facilitate release of a mounted stencil.

20 Claims, 6 Drawing Sheets

STENCIL AND APPARATUS FOR SUPPORTING AND TENSIONING THE STENCIL

RELATED APPLICATIONS

This application is a continuation of prior U.S. application Ser. No. 09/586,824, filed on Jun. 5, 2000, which is a divisional of U.S. application Ser. No. 09/483,253 (now U.S. Pat. No. 6,289,804), filed on Jan. 13, 2000, which is a continuation of U.S. Ser. No. 08/983,621 (now U.S. Pat. No. 6,067,903), filed on Jun. 1, 1998. Additionally, like the preceding applications, this application claims the benefits of both PCT Application PCT/GB96/01722, filed Jul. 18, 1996, and GB9514927.4, filed on Jul. 20, 1995. The entire teachings of each of the above-listed priority applications are incorporated herein by reference.

BACKGROUND

In GB 2264460 of Micro Metallic Limited, there is disclosed a support and tensioning frame and a rectangular stencil mountable thereon wherein at least two opposite edge regions of the stencil have apertures which receive displaceable mounting fingers or mounting teeth on opposite sides of the frame and tension the stencil by rotary or linear displacement of the teeth which abut the edges of the stencil and lie out of the main plane of the stencil in the tensioned condition.

In GB 2292115A of N. M. Baker, a mounting frame is disclosed wherein springs bias stencil mounting bars inwardly into a non-tensioning position and manually operable levers are used to displace cams to move at least two adjacent mounting bars outwardly to tension the stencil. Manual operation is required and the cams may not apply the same even tension nor the same force nor is there the same ease of stencil mounting as in the present invention and the connection means of this prior application extend into the plane of the main body of the stencil.

SUMMARY

A support and tensioning frame for a stencil for enabling soldering paste to be applied to electric circuit boards comprises a rectangular support frame with each of at least two opposite side regions of the frame having an elongate stencil support surface against which a stencil abuts and is flexed in such region on tensioning, and a displaceable mounting bar carrying a row of projections or teeth that are insertable and engageable in apertures in opposite side regions of a stencil. The mounting bars of said at least two opposite sides of the frame are permanently biased, for example, by spring means, to move away from each other into the stencil engaging position of the teeth. Optionally operable displacing means are provided for optionally displacing each said mounting bar against the action of its biasing means to displace the mounting bars into closer proximity and, in use, to displace the tensioning teeth out of the apertures in the opposite side regions of the stencil to permit the stencil to disengage from the teeth and frame.

For achieving most accurate stenciling results, a rectangular (e.g., square) stencil can be tensioned along all four sides; the following description will mainly be in respect of a stencil having teeth-receiving apertures along all four sides thereof and to a supporting and tensioning frame having mounting bars and tensioning teeth along all four sides thereof.

The frame can operate such that the mounting means, which can be in the form of teeth, do not extend into the plane in which the main central body of the stencil lies when tensioned, which means the edge regions of the stencil have to be flexed over/under surfaces of the frame to be engaged by the mounting teeth in this embodiment.

The optionally operable displacing means can accordingly be provided along all four sides of the frame and can be simultaneously operable and can comprise an inflatable and deflatable tubular or other flexible elongate member (normally closed at one end), which can extend continuously around the four sides of the frame so as to act on the four displaceable mounting bars equally and simultaneously. A releasable valve means can be provided to optionally maintain the tubular means in the inflated condition prior to tensioning of the stencil and until the valve means is released to cause deflation of the tubular means via the biasing means to enable the teeth to engage in the apertures in edges of the stencil. The displacing means can be pneumatically inflatable.

The supporting and tensioning frame can be formed as a continuous channel formed of side sections with corner connecting blocks and with side sections of substantially U-section with the outermost limb or wall being of a shorter length than the inner limb or wall to facilitate mounting of the stencil—as will be subsequently described.

Also, a stencil support and mounting means for facilitating the engagement of teeth of at least two opposite side regions of a rectangular supporting and tensioning frame in apertures in at least two opposite edge regions of a stencil and for facilitating the deposition of said stencil, comprises a base means form which there extend at least two spaced apart projections providing support surfaces for engagement with at least two opposite edges of a rectangular or square stencil when the stencil is located extending therebetween such that the stencil is freely supportable and downwardly flexible, and guide and location means cooperable with surfaces of a rectangular or square supporting and tensioning frame for the stencil which when said stencil is supported on said projections and said frame is being guided and located seating on said support means, said projections restrain downward deflection of the edge regions of the stencil which is otherwise flexed against an elongate support surface of the frame, and the teeth in said at least two opposite side regions enter into the apertures in the at least two opposite side regions of said stencil and such that on release of optionally operable displacing means of said frame, said teeth are biased to be displaced outwardly to enter in said apertures and engage the stencil and hold the stencil in a tensioned condition.

Also, according to one aspect of the invention, there is provided a combination of frame, stencil and stencil support.

The base means can comprise a rectangular and preferably square sheet, and the at least two projections and the location and guide means thereof are provided by at least two spaced apart stepped members extending along opposite side regions of the base sheet with the inner normally horizontal surface of the steps of at least two facing projections acting to support opposite edges of a stencil and outer substantially vertical or upper extending surfaces of the projections acting to locate and guide the supporting and tensioning frame. Four location and guide means can be provided—one along each side so that a precise location of the teeth within the apertures in the stencil is achieved. Other arrangements, such as a plurality of spaced apart projections and/or corner location/guiding for the frame, may be provided.

The stencil support and mounting means can comprise a rectangular base sheet having four elongate stepped supports each extending along a side of said sheet and each having a shoulder on its inner side for supporting the edge of a stencil above the surface of the base sheet; said stepped supports being shaped and dimensioned and located so that a stencil support and tensioning frame may locate thereover and preferably around although if the projections are two-part, preferably within the outer part, so that teeth of the frame align with slots of a stencil supported on the shoulders of the support and mounting means.

BRIEF DESCRIPTION OF THE DRAWINGS

The invention will be described further, by way of example, with reference to the accompanying drawings, in which.

DETAILED DESCRIPTION

Figure 1:
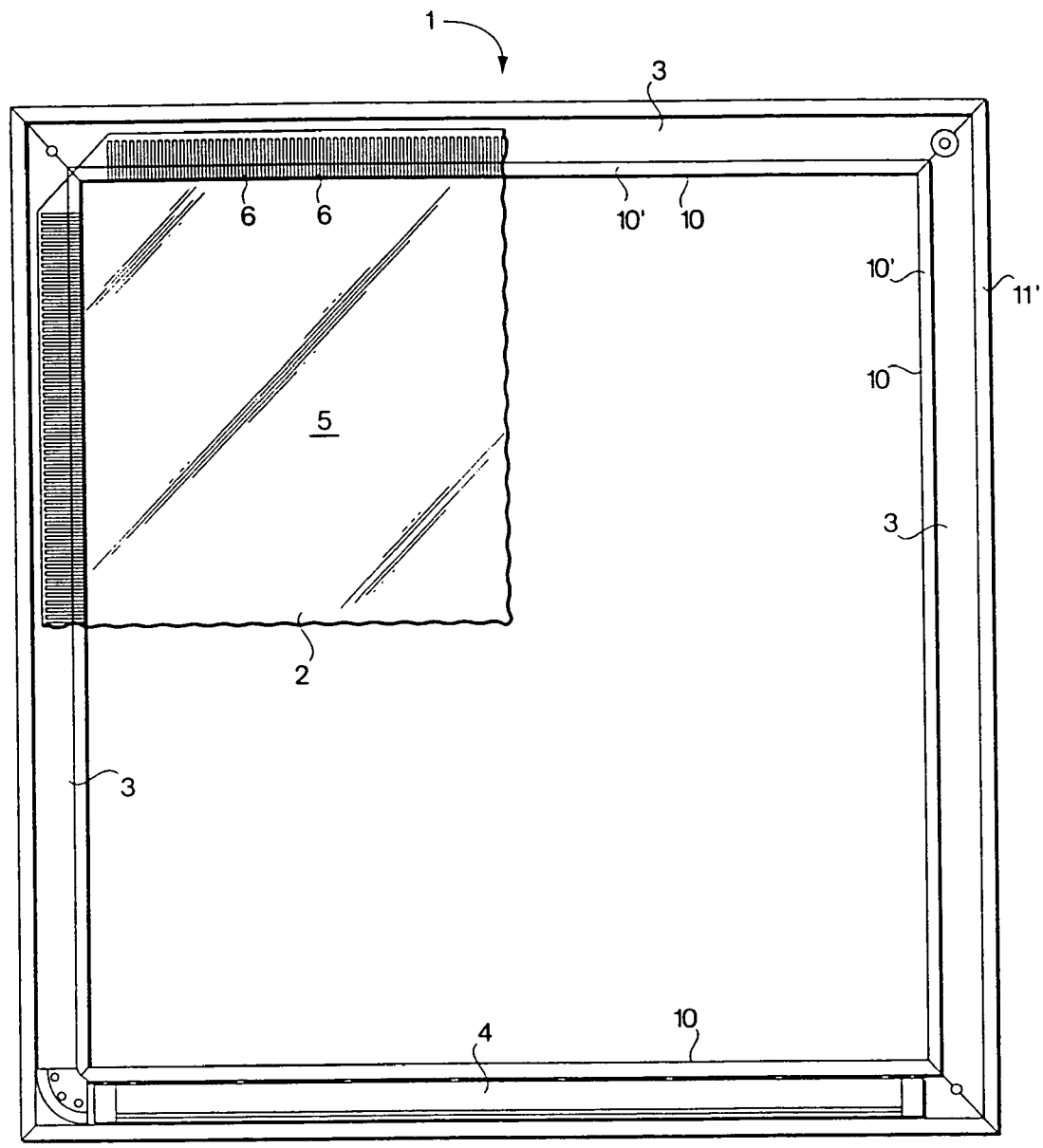
FIG. 1 is an inverted schematic plan view of a square supporting and tensioning frame for supporting a stencil (2) but primarily showing the channel (3) formation of the main part of the frame which is of substantially U-shaped section, and also showing, in the lower edge, a displaceable mounting bar (4) (which is one of four—one each side of the frame 1), whilst in the upper left-hand quadrant (5), a quarter part of a stencil (2) is illustrated, namely an upper quarter part of the stencil (2) having a plurality of parallel elongate slots (6) therein and extending along all four sides of the stencil (2) for receiving teeth (7) of the frame (not shown in FIG. 1 and only one shown in FIG. 2)

The apparatus illustrated in FIGS. 1, 2, 8 and 9 comprises a square support and tensioning frame member 1 formed of channel sides 3 of substantially U-shaped section with inclined corners joined by connecting blocks 22. A square stencil 2 (only a quadrant/quarter 5 thereof being illustrated in the upper left-hand part of FIG. 1) is tensionable on the frame 1 by four rows of teeth 7, each extending from a mounting plate 7' (only one shown) mounted on an inclined surface 4A on each of the displacement mounting bars 4 and held in position by bolts 7" extending therethrough and in to the bars 4. The teeth 7 are locatable in the elongate slots 6 in the four sides of the stencil to engage at the ends thereof to tension the stencil 2. The teeth extend at 45° to the vertical. The slots 6 and separating metal strips 6' are of substantially equal width so that approximately 50% of the stencil material is removed to facilitate flexing and even tensioning.

In FIG. 1, the bottom of the apparatus is illustrated; i.e., it is viewed from below in the position of use and also of mounting and dismounting. The stencil at least in its central region is the lowermost surface of the apparatus and normally has apertures (not shown) formed therein for the passage of solder paste or other material—the thickness of deposition of which is determined by the thickness of the stencil sheet, which is normally of metal.

Four elongate displaceable mounting bars 4 are provided with each one being reciprocably and linearly displaceably mounted on slider bars 8 at least extending through end mounting blocks 4B between the walls (10, 11) defining the channel sections 3 and a plurality of compression springs 9 are provided along each side and being located in bores 1' in the frame 1 and bores 4' in the bars 4 for biasing the mounting bars 4 into an outwardly displaced position in which the teeth 7 carried thereby in use engage in the apertures 6 along the flexed sides of the stencil 2 and act to tension the stencil, with the outer edge regions of the stencil 2 being flexed out of the operative, lowermost main plane of the stencil sheet (over surfaces 10')—the teeth 7 also being located above said plane. The plurality of springs 9 are provided along each side to provide for balanced tensioning.

Figure 2:
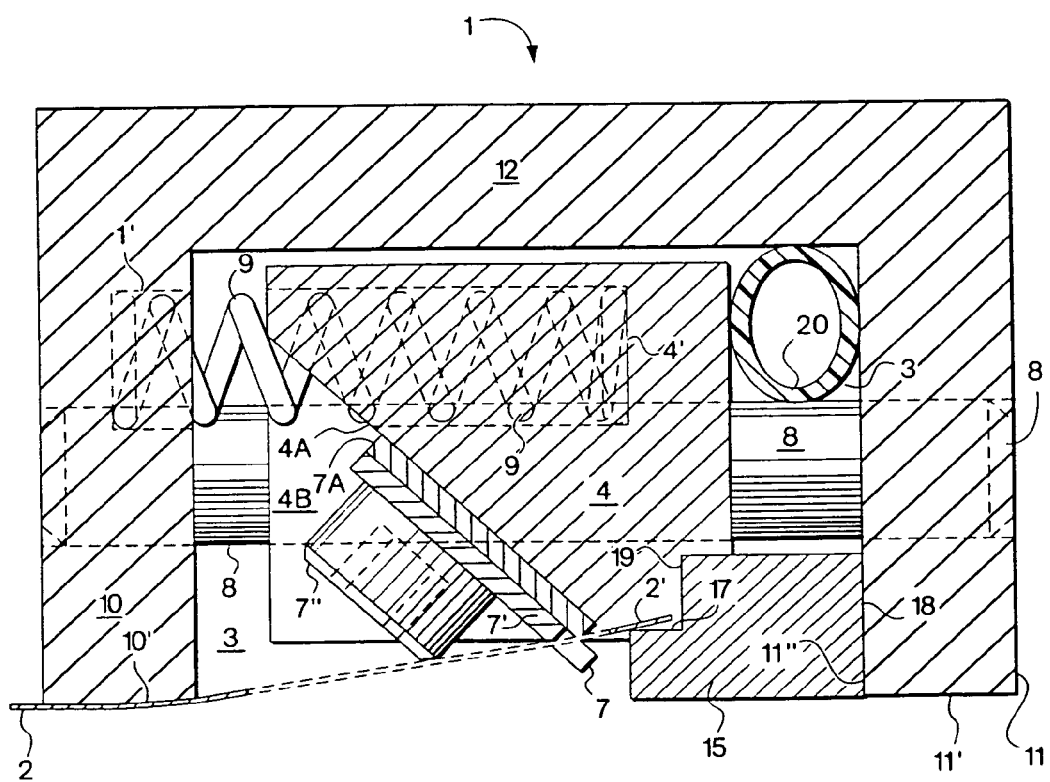
FIG. 2 is an enlarged fragmentary schematic section through one side of the stencil supporting and tensioning frame (1) and with the U-shaped channel (3) including the displaceable mounting bar (4) carrying a row of teeth, spring biasing means and an optionally inflatable displacing means together with the projection of a stencil supporting means.
Figure 3:
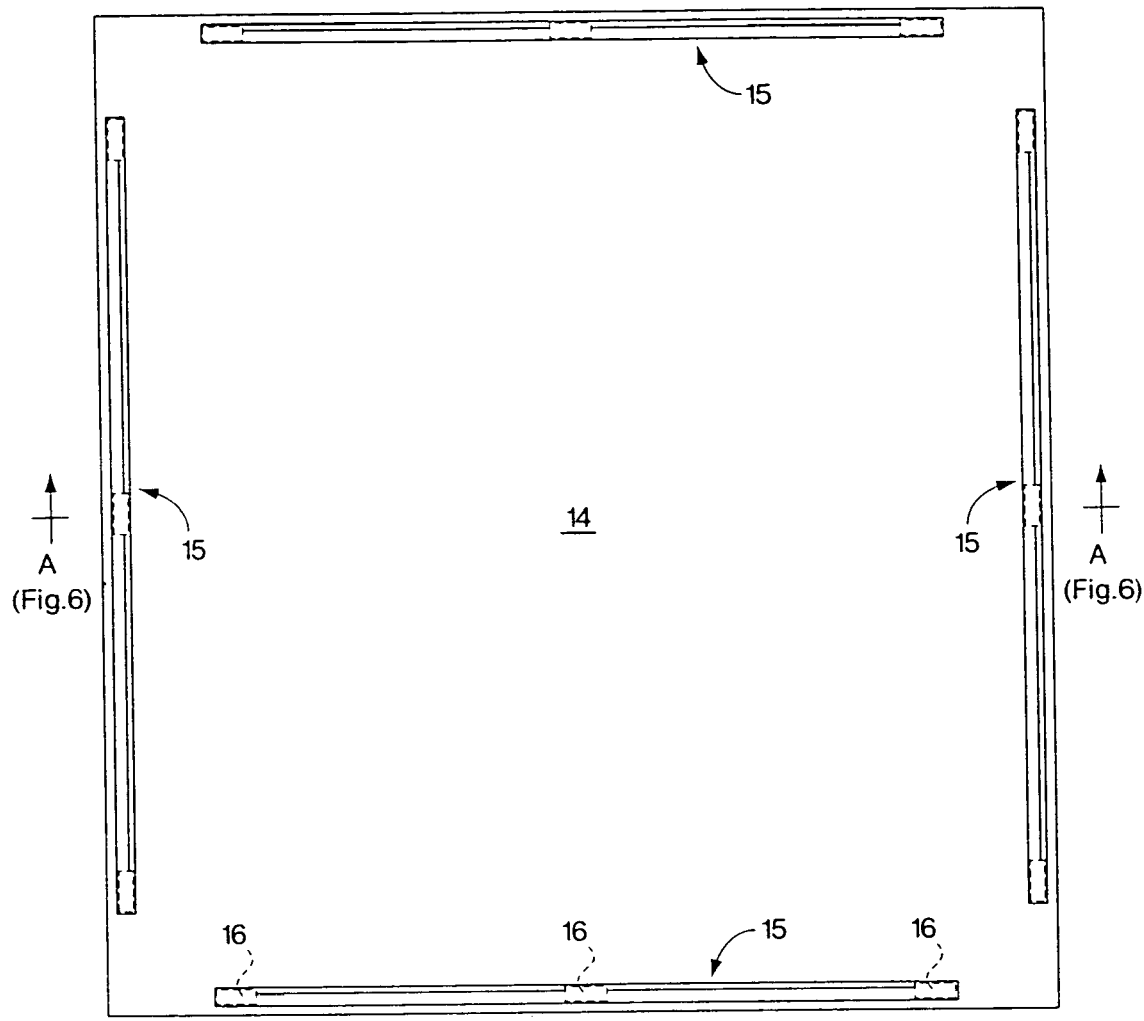
FIG. 3 is a plan view of a stencil support and mounting means incorporating the projection and location and guide means illustrated in solid black in FIG. 2 and provided along four sides of a base means or sheet.
Figure 4:
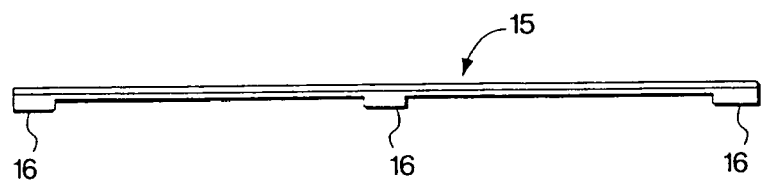
FIG. 4 is an elevation of one projection means and location and guide means of one side and which is located by being pressed into apertures in the base sheet.
Figure 5:
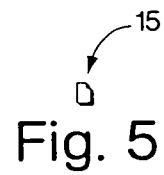
FIG. 5 is an end elevation of the means of FIG. 4.
Figure 6:
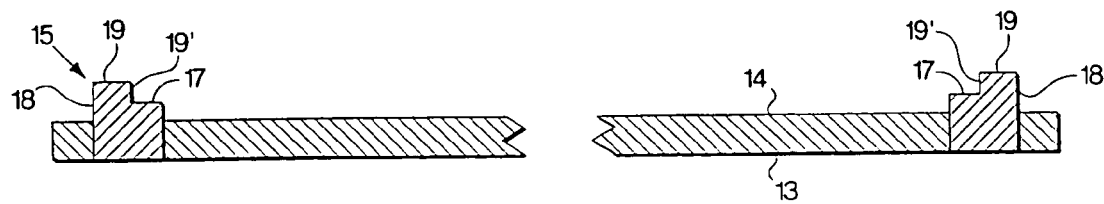
FIG. 6 is a section on line A—A of FIG. 3 through the stencil support and mounting means.
Figure 7:
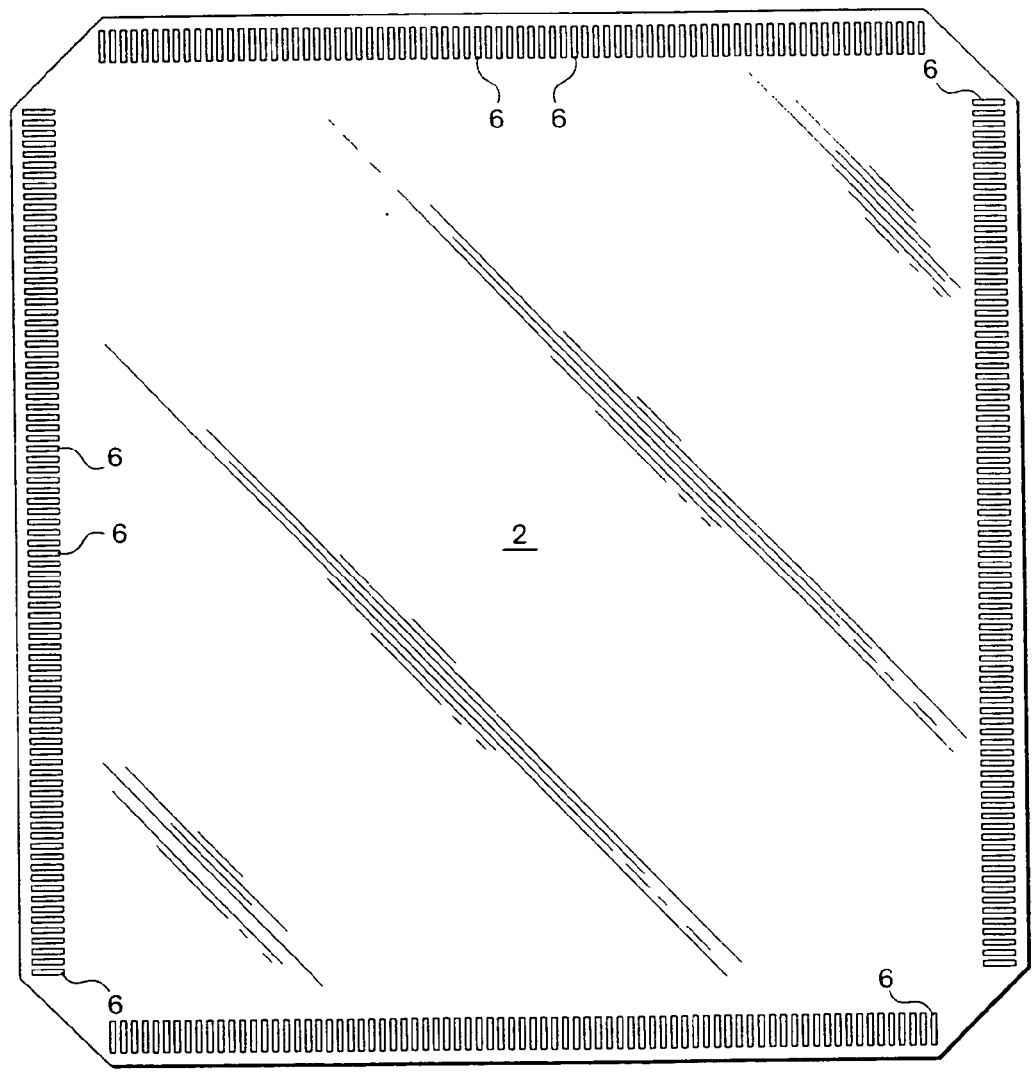
FIG. 7 is a plan of the whole of the metal stencil partly shown in FIG. 1.
Figure 8:
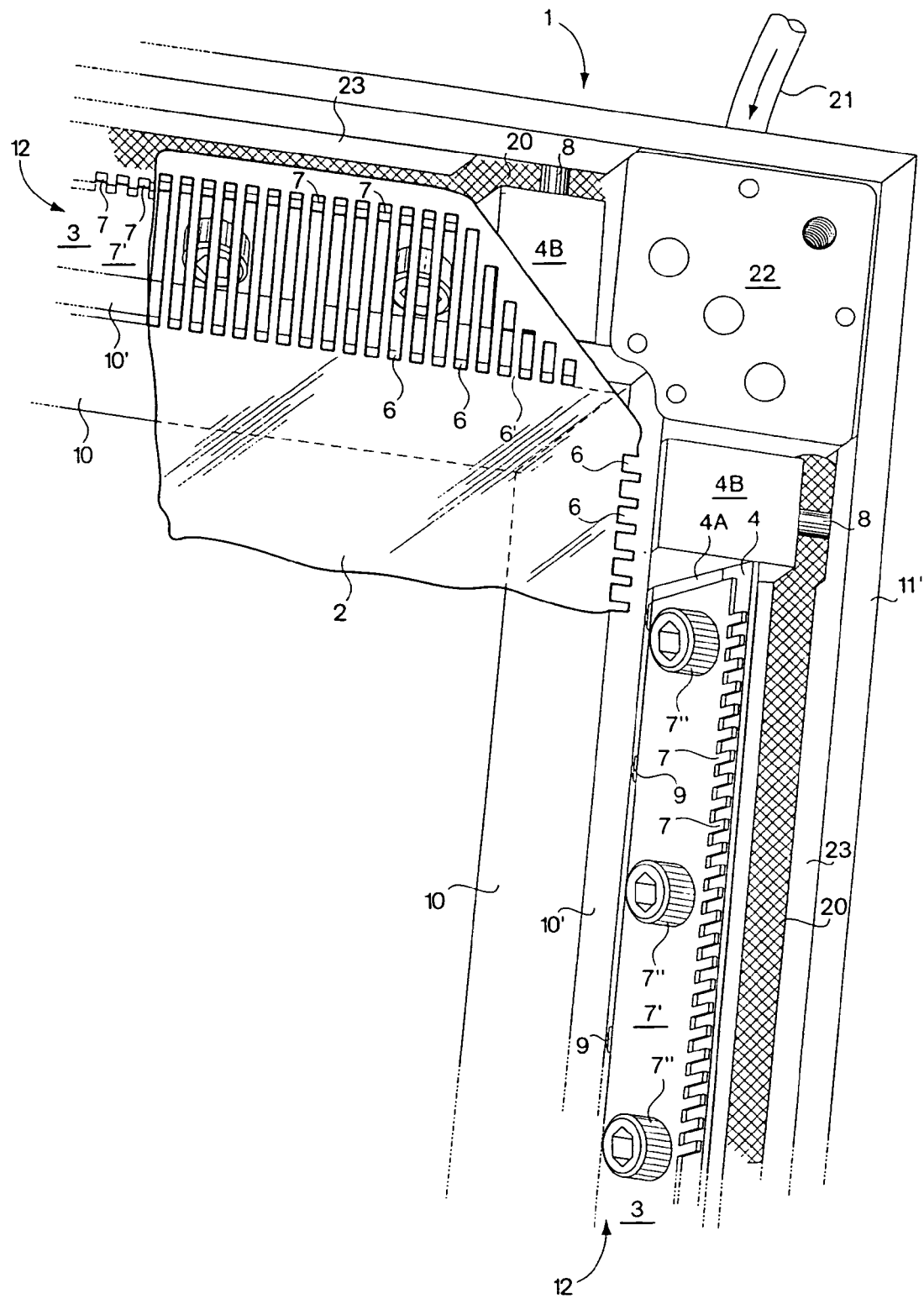
FIG. 8 is an enlarged fragmentary detail of the supporting and tensioning frame and comprising a perspective view of a corner region with part of the stencil illustrated—the displacing means being in the inflated condition (the other corners correspond except for inlet 21)
Figure 9:
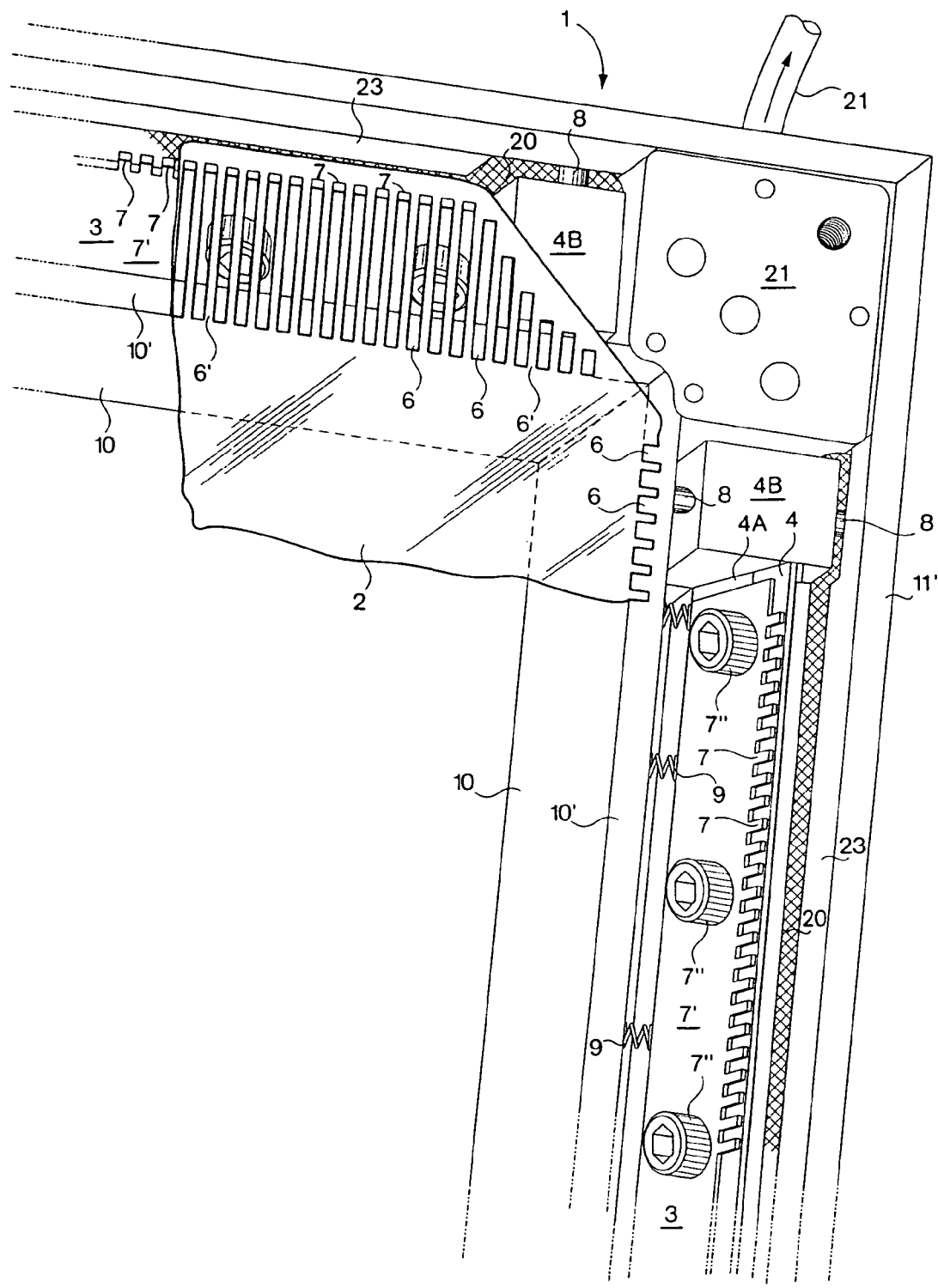
FIG. 9 is a view similar to FIG. 8 but with the displacing means deflated and the consequential movement exaggerated.

The normally inverted U-shaped channel section 3 illustrated in FIG. 2 (and FIGS. 8 and 9) comprising two limbs 10 and 11 connected by a web 12 and has an inner limb 10 with an elongate stencil support surface 10' which can be curved to provide a smooth transition and is locatable in position lower than the surface 17 of a stencil support 13 (FIGS. 3–6 to be described) and is in such disposition above the surface 11' of the outer limb 11 of the U-shaped section, which surface 11' is intended to rest on the upper surface base member (14) of a stencil support means 13. An inflatable, flexible tube 20 (shown compressed/deflated in FIGS. 2 and 9) extends around the frame between outer limbs 11 and bars 4 and also extends from inlet pipe 21, which leads to a pressurized air supply to effect inflation and control valve means, which also releases the pressure within the flatable tube/airbag 20. The other end of tube 20 is closed at the corner block to which inlet pipe 21 is connected. The tube 20 extends between bars 4 and the outer limb 11 of frame 1. Up inflation, the tube urges bars 4 against springs 9 to permit stencil loading/unloading. An L-shaped retaining plate 23 is secured along each side, and one limb thereof holds the tube 20 in place—see FIGS. 8 and 9. Corner blocks 22 have passages (not shown) through which tube 20 extends to its closed end and thus simultaneous inflation or deflation is possible along the four sides.

The stencil supporting and mounting means 13 are illustrated in FIGS. 3 to 6 and comprise a square base panel 14 of still material and four identical and identically located projections 15 extending therefrom and parallel to the four sides of base panel 14, which has three apertures in each side for securely receiving locating lugs 16. Each projection 15 has support surfaces 17 for receiving the outer edges of the stencil 2 and a guide surface 18 against which the inner surface of limb 11 of the frame 1 slides. The four surfaces 18 together act to precisely locate the frame 1 relative to the apertures 6 in stencil 2 so that teeth 7 enter such (i.e., are in register).

In an alternative arrangement (not illustrated), four identically arranged but partly inclined slotted projections are provided to provide the same support for the stencil; but, additionally, the slots register with the slots of the stencil when laid on top to facilitate the engaging/disengaging of the teeth. Locating bolt heads also locate in apertures in the corners of the mounting frame so that accurate registration is achieved.

In explanation of the cooperation of the frame 1, stencil 2 and mounting means 13 of FIGS. 3–6, the upper surface 17 and vertical surface 19' of all four locating projections 15 act to precisely locate the frame in position with the inner shoulder 19' also precisely locating the stencil so that, when the stencil 2 is located between the four projections 15, it is precisely located; and then the supporting tensioning frame 1 is lowered on to the mounting means 13 so that the surface 10' downwardly displaces the central portion of the stencil 2 with the outer edge 2' being supported on the shoulder 17 so that, as the tensioning frame 1 is lowered, the teeth 7 on each of the mounting bars 4 enter into the apertures 6 in the side regions of the stencil 2.

Once the mounting frame has been located with the teeth 7 extending through the elongate apertures 6 in the edge regions of the stencil, an optionally operable displacing means or inflated inflatable tube 20 is de-pressurized (via outlet pipe 20 to assume the position of FIG. 9) with the result that the spring biasing means 9 urge the mounting bars 4 and teeth 7 of all the bars to move outwardly such that the teeth 7 cause the stencil 2 to be tensioned in an accurate and easy manner over surface 10'. The teeth 7 lie out of the main plane of the stencil in the tensioned condition thereof and at all times. In other words, the teeth 7 terminate at a shorter distance from web 12 than does the stencil support wall 10 with surface 10'.

The plates 7', from which the rows of teeth 7 extend, are removable if desired by suitable disengagement of threaded bolts 7", which abut against an inclined surface 4A extending along a side of the bar 4. Shims 7A are mountable in a similar manner.

The apparatus has considerable advantage in that the support means may comprise the packaging of a foil or stencil, e.g., of cardboard or the like; and, thus, no handling of the stencil is required for mounting on the support frame or for dismounting, as such may occur on the supporting means, which provides for considerable safety and avoids damage. Additionally, the springs maintain the stencil in tension when in use and enable the provision of a strong even pressure, and bowing of the side walls is avoided or minimized.

The stencil support and mounting means comprises spaced-apart support and locating means for supporting and locating the opposite edges of a rectangular stencil above a space into which the main body of the stencil is downwardly flexible. Guide and locating means for guiding and locating a rectangular supporting and tensioning frame for the stencil and associated with said support and locating means such that the mounting teeth of said frame register with the apertures in the stencil when the stencil and frame are supported on the support and mounting means.

What is claimed is:

1. An apparatus for printing materials onto surface contacts on an electronic substrate, the apparatus comprising:
   a stencil comprising a metallic sheet having one or more apertures formed through the thickness of the metallic sheet to define a pattern for printing solder on a substrate, the metallic sheet having four peripheral edges, and the metallic sheet defining more than two slots along each peripheral edge;
   a support frame having four side members with each side member connected to two other side members and including a channel that extends along each side member;
   at least first and second displaceable opposed mounting members, with each mounting member disposed within the channel and including a mounting plate that carries a plurality of projections extending from the mounting plate to comprise a terminal side edge, the projections configured to engage the slots along a peripheral edge of the metallic sheet;
   a mechanism to bias the first mounting member away from the second opposing mounting member; and
   an inflatable tubular member disposed within the channel and extending along the four side members to displace the first mounting member toward the second opposing mounting member when the tubular member is inflated.

2. The apparatus of claim 1, wherein the stencil is mounted on and held in tension by the projections of the mounting members.

3. The apparatus of claim 1, wherein the channel comprises a substantially U-shaped section with an elongate outer wall and an elongate inner wall, wherein the inner wall is of greater length and height than the outer wall.

4. The apparatus of claim 3, wherein the inner wall comprises an elongate stencil support surface that the stencil abuts when the stencil is mounted to the support frame.

5. The apparatus of claim 4, wherein the elongate stencil support surface is curved to facilitate flexing of the stencil.

6. The apparatus of claim 3, wherein the mechanism to bias the at least first mounting member away from the at least second opposing mounting bar comprises a plurality of compression springs disposed along the inner wall of the channel adjacent each mounting member, wherein the compression springs are received by a plurality of bore holes disposed along the mounting plate to accept the plurality of compression springs.

7. The apparatus of claim 1, wherein the plurality of projections does not extend into a horizontal plane of the stencil when the stencil is engaged and flexed thereon.

8. The apparatus of claim 1, wherein the mounting plate is removably attached to the inclined surface by a plurality of fasteners disposed along the inclined surface.

9. The apparatus of claim 1, wherein the inflatable tubular member further comprises an air control mechanism connected to a first terminal end of the inflatable tubular member to control a supply of air to the inflatable tubular member.

10. The apparatus of claim 9, wherein the air control mechanism includes an air inlet pipe with a terminal end removably connected to an external air supply and a release valve mounted to the air inlet pipe to control flow of air.

11. The apparatus of claim 9, wherein the inflatable tubular member further comprises a second terminal end that is closed.

12. The apparatus of claim 1, wherein the side members of the support frame form a substantially orthogonal structure.

13. The apparatus of claim 1, wherein the first mounting member is engaged with a first side member of the frame, the second mounting member is engaged with a second side member of the frame, a third mounting member is engaged with a third side member of the frame, and a fourth mounting member is engaged with a fourth side member of the frame.

14. The apparatus of claim 1, wherein opposite edges of the metallic sheet are of equal length.

15. The apparatus of claim 1, wherein the four peripheral edges of the stencil each define more than twenty slots.

16. The apparatus of claim 1, wherein the slots are in the form of elongated slots separated by elongated strips.

17. The apparatus of claim 16, wherein the elongated slots and the elongated strips are of substantially the same width.

18. An apparatus for supporting and tensioning a stencil to enable solder printing of circuit boards and other electronic substrates, comprising:
  a support frame having four side members with each side member connected to two other side members and including a channel that extends along each side member;
  at least first and second displaceable opposed mounting members with each mounting bar disposed within the channel;
  a mechanism to bias the at least first mounting bar away from the at least second opposing mounting bar; and
  an inflatable tubular member disposed within the channel and extending along the four side members to displace the at least first mounting bar toward the at least second opposing mounting bar when the tubular member is inflated.

19. The apparatus of claim 18, wherein each mounting member includes a mounting plate that carries a plurality of projections extending from the mounting plate.

20. The apparatus of claim 18, further comprising a stencil mounted on the mounting bars.

* * * * *

UNITED STATES PATENT AND TRADEMARK OFFICE
CERTIFICATE OF CORRECTION

PATENT NO. : 7,000,538 B2
DATED : February 21, 2006
INVENTOR(S) : David Godfrey Williams It is certified that error appears in the above-identified patent and that said Letters Patent is hereby corrected as shown below:

Column 8,
Line 2, change "MEMBERS" to -- BARS --.
Line 12, change "MEMBER" to -- BAR --.

Signed and Sealed this

Twenty-fifth Day of April, 2006

JON W. DUDAS
*Director of the United States Patent and Trademark Office*